United States Patent
Starnes

(10) Patent No.: US 7,518,947 B2
(45) Date of Patent: Apr. 14, 2009

(54) SELF-TIMED MEMORY HAVING COMMON TIMING CONTROL CIRCUIT AND METHOD THEREFOR

(75) Inventor: Glenn E. Starnes, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 224 days.

(21) Appl. No.: 11/536,136

(22) Filed: Sep. 28, 2006

(65) Prior Publication Data

US 2008/0080297 A1 Apr. 3, 2008

(51) Int. Cl.
*G11C 8/18* (2006.01)
(52) U.S. Cl. .................. 365/233.11; 365/194; 365/193; 365/233.5
(58) Field of Classification Search .......... 365/233, 365/233.1, 233.11, 194, 193, 233.5
See application file for complete search history.

(56) References Cited

U.S. PATENT DOCUMENTS

| | | | | |
|---|---|---|---|---|
| 4,257,104 A | * | 3/1981 | Martin et al. ............ | 702/68 |
| 5,329,176 A | | 7/1994 | Miller, Jr. et al. | |
| 5,357,480 A | * | 10/1994 | Vinal ..................... | 365/233.5 |
| 5,388,075 A | * | 2/1995 | Vinal ..................... | 365/189.05 |
| 5,999,482 A | * | 12/1999 | Kornachuk et al. ...... | 365/233.1 |
| 6,061,293 A | * | 5/2000 | Miller et al. ........... | 365/230.08 |
| 6,275,070 B1 | * | 8/2001 | Pantelakis et al. ............ | 326/98 |
| 6,282,131 B1 | | 8/2001 | Roy | |
| 6,711,092 B1 | * | 3/2004 | Sabharwal ............ | 365/233.15 |
| 2002/0145932 A1 | * | 10/2002 | Nguyen et al. .............. | 365/227 |
| 2003/0202399 A1 | * | 10/2003 | Nguyen et al. .............. | 365/200 |
| 2005/0180228 A1 | * | 8/2005 | Canada et al. .............. | 365/194 |

\* cited by examiner

*Primary Examiner*—Hoai V Ho
*Assistant Examiner*—Jay Radke
(74) *Attorney, Agent, or Firm*—Daniel D. Hill

(57) ABSTRACT

A memory comprises a memory array and a plurality of clock driver circuits for providing a plurality of clock driver signals for timing an access to the memory array. A timing control circuit is coupled to the plurality of clock driver circuits. The timing control circuit includes a latch that is coupled to each of the plurality of clock driver circuits. The latch is for storing a logic state representative of a logic state of each of the plurality of clock driver signals in response to a first predetermined edge of a clock signal. The timing control circuit removes complex logic gates from the clock critical timing paths. Also, circuit topology is simplified allowing improved critical timing performance. Also, all of the clock driver circuits share a common latch control to improve clock recovery synchronization and reduce a risk of initializing the clock timing circuit in the wrong logic state.

19 Claims, 7 Drawing Sheets

SELF-TIMED MEMORY HAVING COMMON TIMING CONTROL CIRCUIT AND METHOD THEREFOR

FIELD OF THE INVENTION

This invention relates to memories, and more particularly, to a self-timed memory having a common timing control circuit and method therefor.

BACKGROUND

Many integrated circuits, such as memories, use clock signals to time and synchronize operations. Today, integrated circuits are commonly required to complete many operations within one clock period of the clock signal. For example, a "self-timed" memory may begin a read or a write access with a rising edge of a clock signal and then time the events required for the read or write access internally before the next rising edge. A static random access memory (SRAM) is a memory type that is commonly used in high speed applications and is sometimes self-timed to complete an access in one clock cycle or less. As clock speeds increase, the amount of time available to complete all of the events required for an access to an SRAM memory array is reduced.

FIG. 1 illustrates a clock timing circuit 10 for a self-timed memory in accordance with the prior art. Clock timing circuit 10 includes clock drivers 11, 13, 15, and 32, reset latch 24, write delay circuit 26, read delay circuit 28, and OR logic gate 30. Each of the clock drivers 11, 13, and 15 includes a set latch and a driver, or buffer, circuit. For example, clock driver 11 includes set latch 12 and driver 14, clock driver 13 includes latch 16 and driver 18, and clock driver 15 includes latch 20 and driver 22. Each of the latches 12, 16, 20, and 24 receives a system clock signal labeled "CLK" from, for example, a data processing system (not shown). Also, each of the latches 12, 16, 20, and 24 receives various other control signals, such as for example, an ENABLE signal, a RESET signal, a CLK_SR signal, and a WR_STROBE signal. Typically, an access to a memory (not shown) having clock timing circuit 10 begins at a rising edge of the system clock signal CLK. When the memory is accessed, a logic state of the clock signal CLK is latched in response to one or more enable signals. A chain of events required to access the memory is controlled by the clock driver circuits which represent separate clock timing paths for the memory. In clock timing circuit 10, clock driver 11 provides a timing signal labeled "CLK_ADDR_B" to latch an address for selecting one or more memory cells. Clock driver 13 provides clock signal CLK_WRITE_B to indicate whether the selected memory cells are to be written to or read from. Clock driver 15 provides clock signal CLK_DEC_B to address decoders. In the event of a read operation, clock driver 32 turns on the sense amplifiers at the appropriate time. Delay elements are used to provide the correct timing. For example, during a write operation, write delay element 26 provides write strobe WR_STROBE a predetermined delay after clock signal CLK_ADDR_B is asserted. Likewise, during a read operation, read delay element 28 provides another predetermined delay after clock signal CLK_ADDR_B is asserted before providing CLK_DEC_B and CLK_SENSE_B to the decoders and sense amplifiers, respectively. At the end of the read or write access, a feedback clock recovery signal labeled "STROBE" from the output of OR logic gate 30 to an input of reset latch 24 via a predetermined delay 29 is used to reset the latched state of the system clock signal CLK to an initial logic state in preparation for another memory access.

FIG. 2 illustrates a portion of the clock timing circuit of FIG. 1 in more detail. In FIG. 2, reset latch 20 includes NAND logic gates 36, 38, and 40, NOR logic gate 42 and driver 22. NAND logic gates 38 and 40 are cross-coupled to provide a latch 34. Driver 22 is implemented with an inverter as illustrated. Reset latch 24 includes NAND logic gates 44, 46, 52 and 48, and NOR logic gate 50. Self-timed delay 54 represents the delay provided by the combination of write delay 26, read delay 28, OR logic gate 30, and delay 29 (FIG. 1). NAND logic gates 46 and 52 provide the latching function for reset latch 24. As described above, reset latch 24 is used to reset the set latches to an initial logic state at the end of a memory access. The logic state of the clock signal CLK is held by set latch 20 until reset to the initial state by the feedback recovery signal STROBE_D (FIG. 1). Each of clock driver circuits 11 and 13 are similar to clock driver circuit 15.

A speed critical path for the clock driver circuit 15 includes a path between the clock signal CLK input of NAND logic gate 36, through latch 34 and inverter 22. When a system clock signal CLK is provided to clock driver 15 it is latched in the cross-coupled NAND logic gates 38 and 40 before being provided to the output of clock driver 15. Latching the clock signal CLK in the driver circuit of FIG. 2 adds additional gate delays to the speed critical path that may prevent the memory from meeting timing requirements for higher clock speeds. Also, having a memory with three or more independent timing paths increases clock timing complexity.

Thus, there is a need for self-timed memory with a clock timing circuit that solves the above problems.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION

The terms "assert" or "set" and "negate" (or "de-assert" or "clear") are used when referring to the rendering of a signal, control bit, or similar apparatus into its logically true or logically false state, respectively. If the logically true state is a logic level one, the logically false state is a logic level zero. And if the logically true state is a logic level zero, the logically false state is a logic level one.

Therefore, each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Generally, a self-timed memory is provided with a clock timing circuit that removes complex logic circuits from the critical timing path and separates a clock timing path from a clock latch control path. In one embodiment, the memory includes a plurality of memory cells, an address decoder for selecting a memory cell in response to an address, a data input/output circuit for transmitting data to or from the selected memory cell, a plurality of clock driver circuits, and a timing control circuit. The plurality of clock driver circuits provides the internal timing signals for controlling a memory access in response to receiving a system clock signal. The timing control circuit is coupled to the plurality of clock driver circuits and includes a latch for latching a logic state representative of a logic state of each of the plurality of internal clock signals. One result is that complex logic gates are removed from the clock critical timing paths. Also, circuit topology is simplified allowing improved critical timing performance. Also, all of the clock driver circuits share a common latch control to improve clock recovery synchronization and reduce a risk of initializing the clock timing circuit in the wrong logic state. This is better understood by reference to the drawings and the following description.

Figure 3:
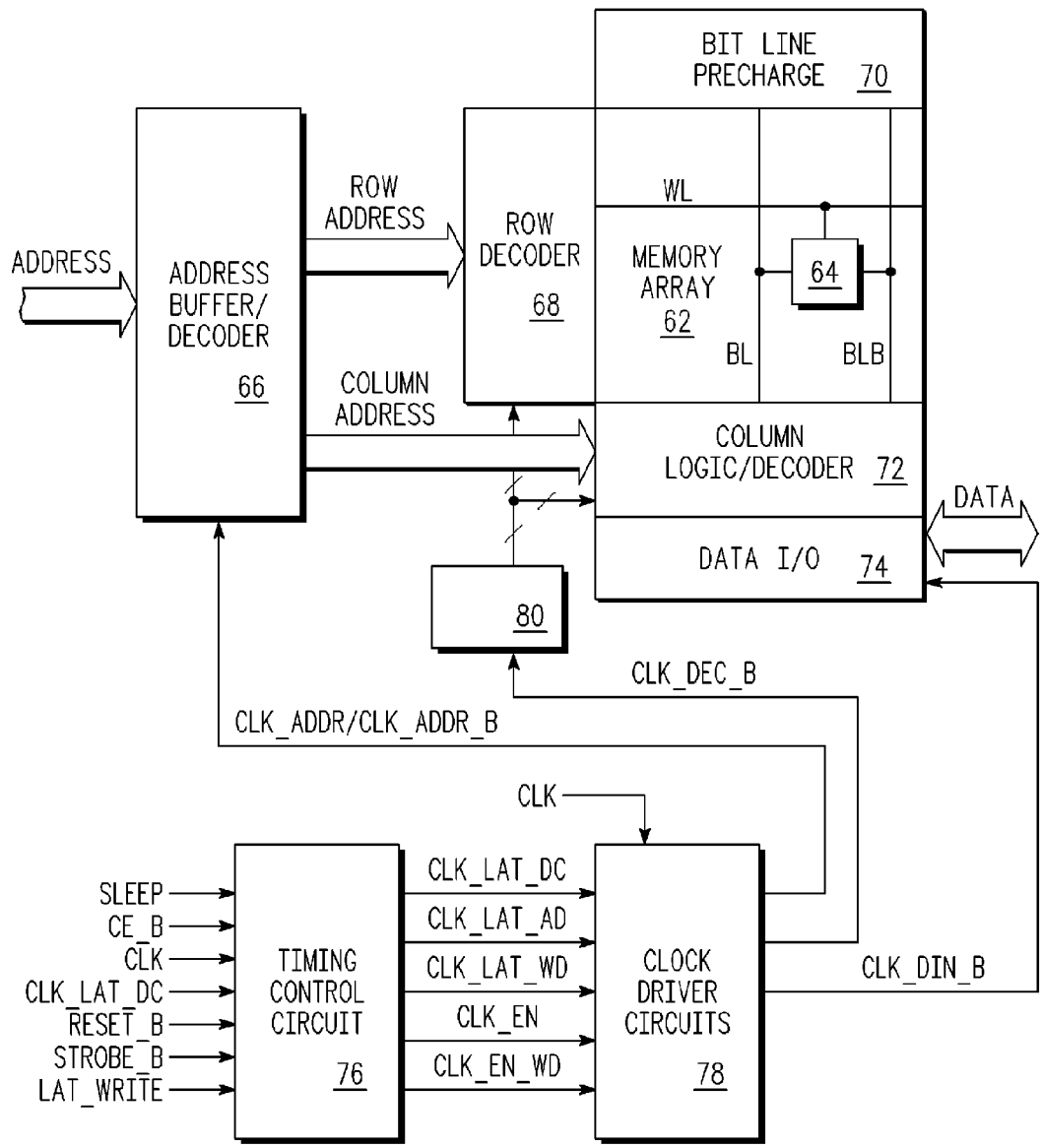
FIG. 3 illustrates a memory in accordance with one embodiment.

FIG. 3 illustrates a memory 60 in accordance with one embodiment. Memory 60 includes memory array 62, address buffer/decoder 66, row decoder 68, bit line precharge and equalization circuit 70, column logic/decoder 72, data input/output (I/O) 74, timing control circuit 76, and clock driver circuits 78. Memory array 62 includes a plurality of memory cells organized in rows and columns. In FIG. 3, the plurality of memory cells is represented by memory cell 64 coupled to a word line labeled "WL" and a bit line pair labeled "BL" and "BLB". In the illustrated embodiment, memory cell 64 is a conventional static random access memory (SRAM) cell. In other embodiments, memory cell 64 may be a different type of volatile or non-volatile memory cell. Also, in other embodiments, the memory cells may be coupled to only one bit line instead of a pair of bit lines. In addition, in other embodiments, the array may be organized as multiple "blocks" or sections of memory cells.

Address buffer/decoder 66 receives an address labeled "ADDRESS" and provides row address signals ROW ADDRESS to row decoder 68 and column address signals COLUMN ADDRESS to column logic/decoder 72. Row decoder 68 selects a word line, such as word line WL, and column logic/decoder 72 selects a bit line pair, such as bit line pair BL and BLB. If an access to the memory array is a read operation, the memory cell located at the intersection of the selected word line and bit line pair is coupled to the bit line pair to provide a stored logic state to the bit line pair. Column logic/decoder 72 includes logic and decoders for selecting a pair or pairs of bit lines to be accessed, and a sense amplifier for sensing and amplifying the logic state provided on the bit line pair. The sensed logic state is then provided to data I/O 74. Data I/O 74 is bi-directionally coupled to column logic/decoder 72 and includes data input and data output buffers for providing data on bi-directional terminals labeled "DATA".

During a read operation, data I/O 74 provides a bit from a selected memory cell onto an I/O terminal labeled "DATA". If the access is a write operation, a bit is provided as at I/O terminal DATA and coupled to the selected bit line pair. Other embodiments may include separate input and output data terminals.

Bit line precharge and equalization circuit 70 is coupled to each bit line pair of the memory array 62 and is for precharging and equalizing a voltage on each bit line pair to a predetermined voltage prior to each memory access.

Memory 60 is a "self-timed" memory. In memory 60, a read or write operation is initiated on an edge of a clock signal, usually a rising edge, and timing of the read or write operation is provided using a plurality of clock driver circuits 78 under the control of timing control circuit 76. In one embodiment, memory 60 is an embedded memory in an integrated circuit data processing system. Timing control circuit 76 includes a plurality of input terminals and a plurality of output terminals. In one embodiment, the plurality of input terminals may receive a system clock signal and various control signals from a processor coupled to the memory 60. Regarding timing control circuit 76, a first input terminal receives a control signal labeled "SLEEP", a second input terminal receives a chip enable signal labeled "CE_B", a third input terminal receives a system clock signal labeled "CLK", a fourth input terminal receives a control signal labeled "CLK_LAT_DC", a fifth input terminal receives a control signal labeled "RESET_B", a sixth input terminal receives a control signal labeled "STROBE_B, and a seventh input terminal receives a control signal labeled "LAT_WRITE". Note that a "B" at the end of a signal name indicates that the signal is active as a logic low. Timing control circuit 76 has a plurality of output terminals coupled to a plurality of input terminals of clock driver circuits 78 for providing a plurality of control signals to clock driver circuits 78. In FIG. 3, a first output terminal provides a control signal labeled "CLK_LAT_DC" to a first input terminal of clock driver circuits 78. A second output terminal provides a control signal labeled "CLK_LAT_AD" to a second input terminal of clock driver circuits 78. A third output terminal provides a control signal labeled "CLK_LAT_WD" to a third input terminal of clock driver circuits 78. A fourth output terminal provides a fourth control signal labeled "CLK_EN" to a fourth input terminal of clock driver circuits 78. A fifth output terminal provides a control signal labeled "CLK_EN_WD" to a fifth input terminal of clock driver circuits 78. In addition, clock driver circuit has a clock input terminal for receiving a clock signal labeled "CLK". Clock driver circuits 78 also includes a plurality of output terminals for providing signals for controlling the operation of memory 60. A first output terminal is coupled to an input terminal of address buffer/decoder 66 for providing control signals labeled "CLK_ADDR/CLK_ADDR_B". A second output terminal of clock driver circuits 78 is coupled to an input of local clock recovery circuits 80 for providing a control signal labeled "CLK_DEC_B". An output terminal of local clock recovery circuits 80 is coupled to an input terminal of both row decoder 68 and column logic/decoder 72. A third output terminal of clock driver circuits 78 3 0 is coupled to an input terminal of Data I/O 74 for providing a control signal labeled "CLK_DIN_B".

In operation, during a read or write operation of memory 60, a clock signal is provided by, for example, a data processor (not shown) to timing control circuit 76 and to clock driver circuits 78. In other embodiments, the clock signal CLK may be provided by another source external to memory 60. To begin a read or write access to a memory cell of memory 60, a rising clock edge of clock signal CLK is latched in response to an asserted enable signal CE_B. The plurality of control signals from clock driver circuits 78 are provided in a timed (self-timed) sequence to clock driver circuits 78. In response, clock driver circuits 78 outputs the various control signals to control the various operations of memory 60 necessary for a read or write operation. In the illustrated embodiment, clock driver circuits 78 provides three control signals. In other embodiments, clock driver circuits 78 may output more or fewer control signals to control the operation of memory 60. The operation and advantages of timing control circuit 76 and clock driver circuits 78 will be described in more detail below.

Figure 4:
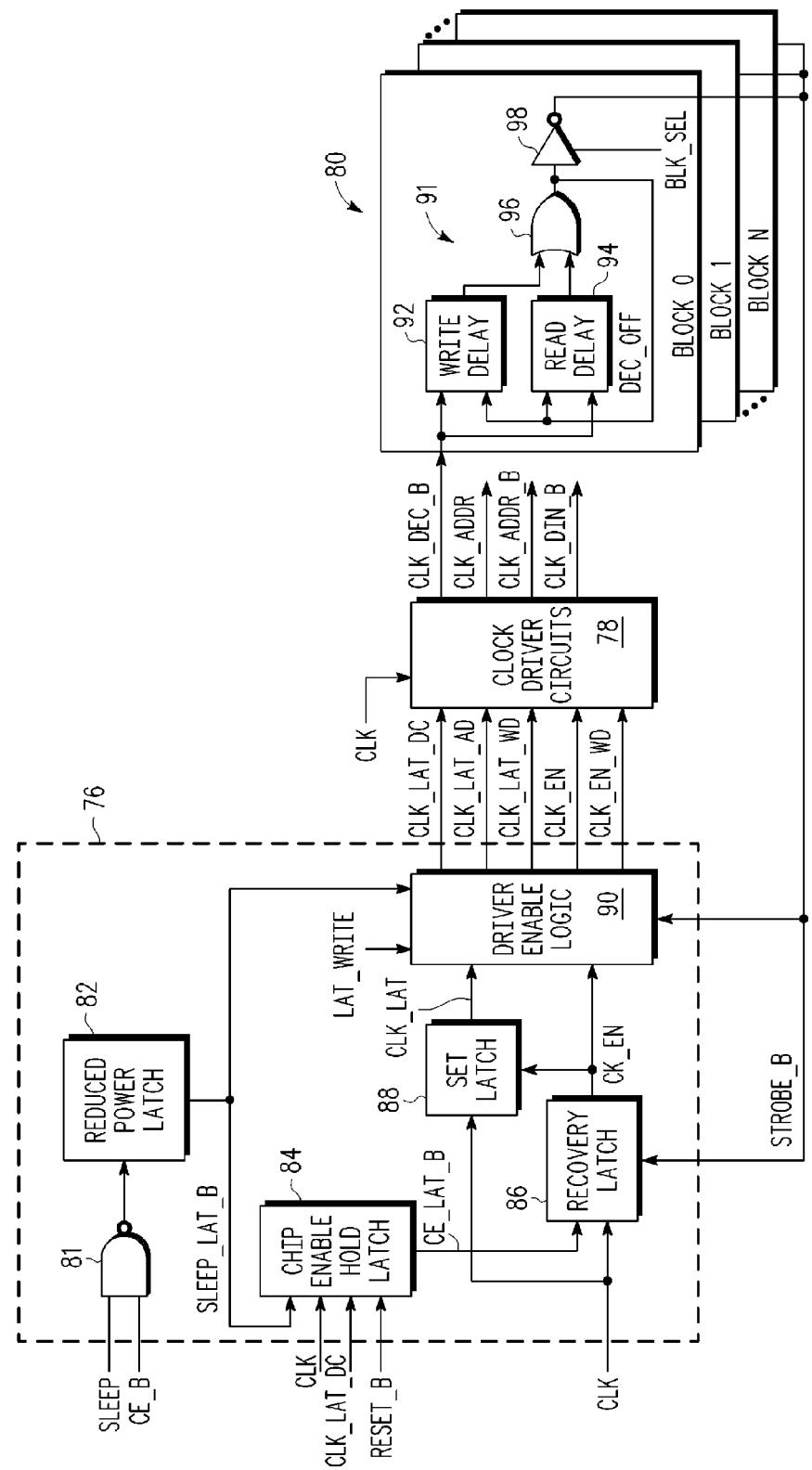
FIG. 4 illustrates a portion of the memory of FIG. 3 in more detail.

FIG. 4 illustrates a portion of memory 60 of FIG. 3 in more detail. In FIG. 3, timing control circuit 76 includes a NAND logic gate 81, a reduced power latch 82, a chip enable hold latch 84, a recovery latch 86, a set latch 88, and driver enable logic 90. Typically, a memory array will be organized as blocks, or sections, of memory cells. Local clock recovery circuits 80 includes one or more portions depending on the number of memory array blocks in the memory array. The one or more portions of local clock recovery circuits 80 correspond to memory blocks in the memory array. For example, in FIG. 4, a local clock recovery circuit 91 is associated with a memory block labeled "BLOCK 0". Other local clock recovery circuits similar to local clock recovery circuit 91 will correspond to other memory blocks, such as for example, memory blocks labeled "BLOCK 1" and "BLOCK N". Note that local clock recovery circuit 91 is a peripheral circuit is not physically implemented within a memory array block. Each block of local clock recovery circuit 80 includes write delay 92, read delay 94, OR logic gate 96, and inverting tristate buffer 98.

In timing control circuit 76, a first input of NAND logic gate 81 receives control signal SLEEP, a second input receives chip enable signal CE_B, and an output is coupled to an input of reduced power latch 82. An output of reduced power latch 82 provides a latch control signal labeled "SLEEP_LAT_B" to inputs of chip enable hold latch 84 and driver enable logic 90. Chip enable hold latch 84 also includes an input for receiving clock signal CLK, an input for receiving latch control signal CLK_LAT_DC, and an input for receiving control signal RESET_B. An output of chip enable hold latch 84 provides latch control signal CE_LAT_B to an input of recovery latch 86. Recovery latch 86 has a clock input for receiving clock signal CLK, an input for receiving feedback recovery signal STROBE_B, and an output for providing control signal CK_EN. Set latch 88 has an input for receiving clock signal CLK, an input for receiving signal CK_EN, and an output for providing latch control signal CLK_LAT. Driver enable logic 90 has an input for receiving latch control signal LAT_WRITE, an input coupled to the output of set latch 88 for receiving signal CLK_LAT, an input coupled to the output of receiver latch 86 for receiving control signal CK_EN, an input for receiving recovery signal STROBE_B, and a plurality of outputs for providing control signals CLK_LAT_DC, CLK_LAT_AD, CLK_LAT_WD, CLK_EN, and CLK_EN_WD.

Clock driver circuits 78 has a plurality of input coupled to the plurality of outputs of driver enable logic 90, and a plurality of outputs for providing control signals CLK_DEC_B, CLK_ADDR, CLK_ADDR_B, and CLK_DIN_B.

In each of local recovery circuits 80, write delay 92 has an input coupled to an output of clock driver circuits 78 to receive control signal CLK_DEC_B, an input coupled to an output of OR logic gate 96 to receiving feedback signal DEC_OFF, and an output coupled to an input of OR logic gate 96. Read delay 94 has an input coupled to receive CLK_DEC_B, an input coupled to receive feedback signal DEC_OFF, and an output coupled to an input of OR logic gate 96. The write delay 92 provides a predetermined delay to track the propagation delay of a write operation of a selected block. Likewise, the read delay 94 provides a predetermined delay to track the propagation delay of a read operation of a selected block. Note that there may be other control signals in the illustrated embodiment that are not shown in the figures because the other control signals are not necessary for describing the illustrated embodiment. For example, write delay 92 and read delay 94 may also receive other read and write control signals (not shown) for selecting one of write delay 92 or read delay 94 during a write operation or read operation, respectively. An output of OR logic gate 96 is coupled to an input of inverting tristate buffer 98. Each inverting tristate buffer 98 has an output for providing feedback recovery signal STROBE_B to an input of recovery latch 86. Also, each buffer 98 has a control input for receiving a separate block select signal BLK_SEL. At the end of an access to memory array 62, the selected block, for example BLOCK 0, buffer 98 will assert feedback recovery signal STROBE_B to begin resetting the set latch 88 to an initial logic state. The buffers 98 of the other unselected blocks will be tri-stated in response to their block signals being de-asserted.

In operation, any condition that asserts clock driver signal CLK_DEC_B will initiate memory array access followed by de-assertion of the clock driver signals by means of the feedback recovery signal STROBE_B. If the memory is comprised of multiple array blocks as illustrated in FIG. 4, only one block will become active in response to a block select signal. The block select signal is asserted in response to clock driver signal CLK_DEC_B. If the access is a write operation, the write delay 92 is started to control the duration of the write access, and if the access is a read operation, the read delay 94 is started to control the duration of the read access. After the delay, an active low signal is provided by the appropriate one of delay circuits 92 and 94 to an input of OR logic gate 96. The DEC_OFF signal causes de-assertion of the active block select signal. Assertion of the signal STROBE_B is qualified by the block decode signal BLK_SEL of the accessed memory array block. The STROBE_B outputs of all of the un-accessed blocks are tristated. De-assertion of block decode signal BLK_SEL causes de-assertion of signal STROBE_B. Thus, the asserted signal STROBE_B has a pulse width dependent on the array block de-selection timing. In one embodiment, de-assertion of STROBE_B occurs approximately at the same time as the de-asserting of the clock driver signals to optimize setup requirements of the clock driver circuits 78 for the next cycle. This is an advantage over a prior art implementation that depends on the falling edge of clock signal CLK.

Figure 5:
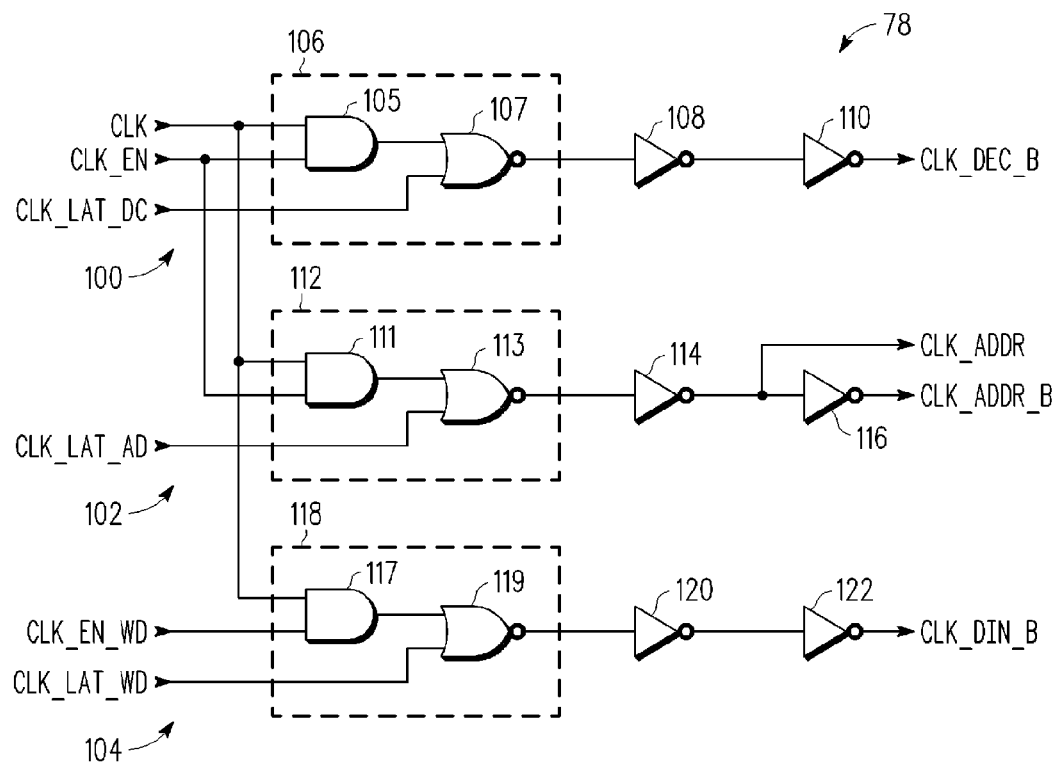
FIG. 5 illustrates the clock driver circuits of FIG. 4 in more detail.

FIG. 5 illustrates, in logic diagram form, clock driver circuits 78 of FIG. 4 in more detail. Clock driver circuits 78 includes clock drivers 100, 102, and 104. Clock driver 100 includes AND-OR-INVERT one stage logic 106, and inverters 108 and 110. Clock driver 102 includes AND-OR-INVERT one stage logic 112, and inverters 114 and 116. Clock driver 104 includes AND-OR-INVERT one stage logic 118, and inverters 120 and 122. Logic 106 includes AND logic function 105 and NOR logic function 107. Logic 112 includes AND logic function 111 and NOR logic function 113. Logic 118 includes AND logic function 117 and NOR logic function 119.

In clock driver 100, AND-OR-INVERT one stage logic 106 has an input for receiving clock signal CLK, an input for receiving clock enable signal CLK_EN, an input for receiving clock latch control signal CLK_LAT_DC, and an output. Inverter 108 has an input coupled to the output of AND-OR- INVERT one stage logic 106, and an output. Inverter 110 has an input coupled to the output of inverter 108, and an output for providing clock control signal CLK_DEC_B. In clock driver 102, AND-OR-INVERT one stage logic 112 has an input for receiving clock signal CLK, an input for receiving clock enable signal CLK_EN, an input for receiving clock latch control signal CLK_LAT_AD, and an output. Inverter 114 has an input coupled to the output of AND-OR-INVERT one stage logic 112, and an output for providing clock control signal CLK_ADDR. Inverter 116 has an input coupled to the output of inverter 114, and an output for providing clock control signal CLK_ADDR_B. In clock driver 104, AND-OR-INVERT one stage logic 118 has an input for receiving clock signal CLK, an input for receiving clock enable signal CLK_EN_WD, an input for receiving clock latch control signal CLK_LAT_WD, and an output. Inverter 120 has an input coupled to the output of AND-OR-INVERT one stage logic 118, and an output. Inverter 122 has an input coupled to the output of inverter 120, and an output for providing clock control signal CLK_DIN_B.

Figure 2:
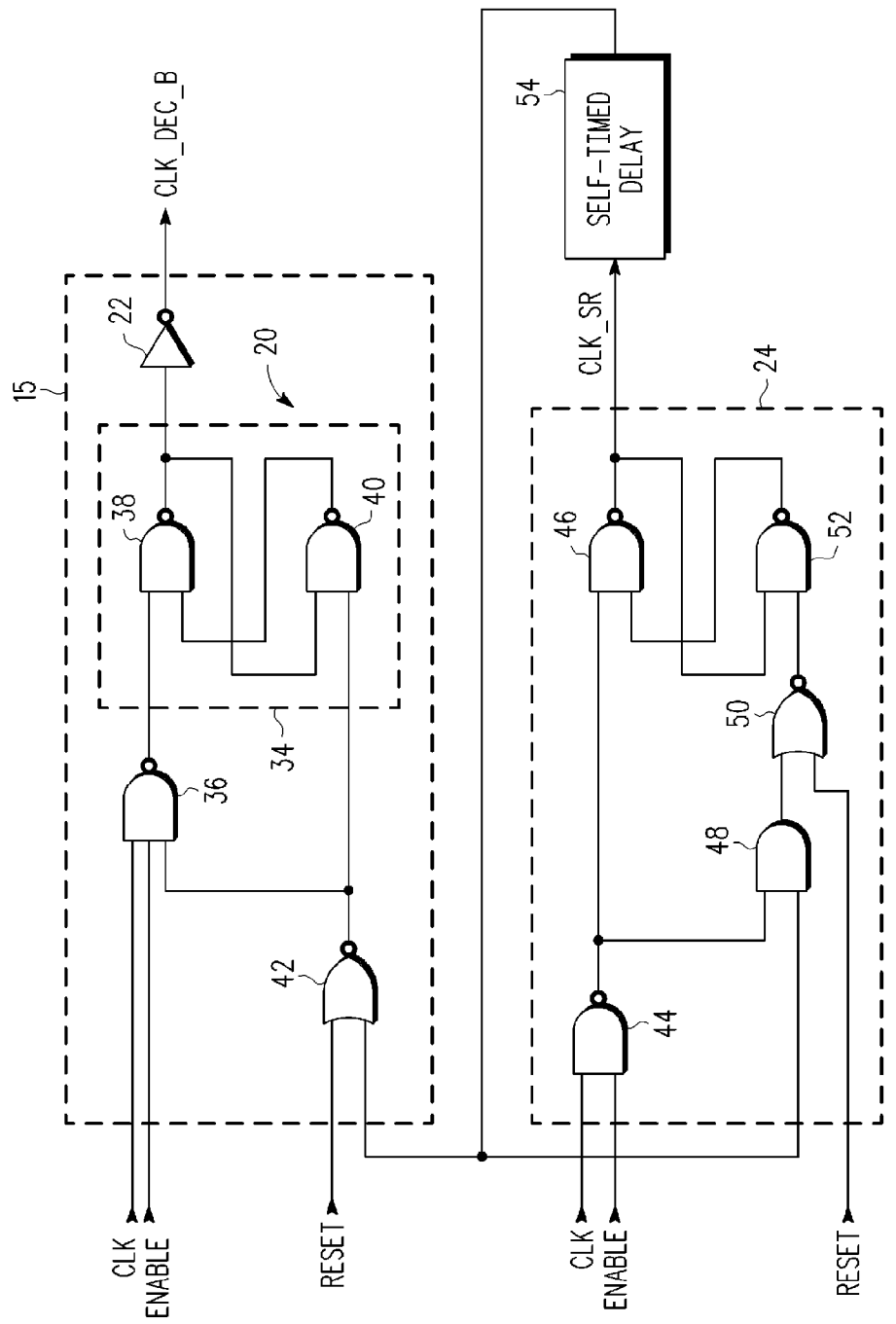
FIG. 2 illustrates a portion of the clock timing circuit of FIG. 1 in more detail.

Clock driver circuits 78 include three separate critical speed clock paths with a common circuit topology for each path made up of clock drivers 100, 102, and 104. In other embodiments, there may be more or fewer than three. A first stage for each driver path uses a single stage gate design in which one of the inputs is the system clock CLK. The single stage gate design is illustrated in more detail in FIG. 6. Another input receives an enable signal that is used to qualify and control a duration of assertion of the clock paths on each clock cycle. The NOR logic function receives the latch signals CLK_LAT_DC, CLK_LAT_AD, and CLK_LAT WD, that are used to hold the assertion of the clock paths independent of the falling edge of clock signal CLK. The enable and latch signals are generated and controlled by the clock latch timing control circuit 76 (FIG. 4), which will be described in more detail in the discussion of FIG. 7. The final two stages of each path are simple inverter gates used to buffer the clock paths for gate and metal line loading requirements. Because clock drivers 100, 102, and 104 form paths that have only one complex gate stage and no cross-coupled gate loading requirements, they have relatively good time performance as compared to the prior art clock driver circuit of FIG. 2.

Figure 6:
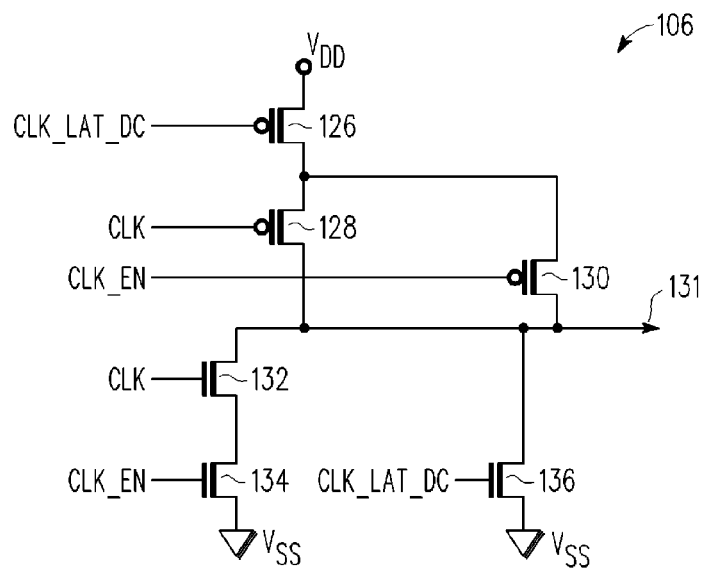
FIG. 6 illustrates a logic circuit of one of the clock driver circuits of FIG. 5 in more detail.

FIG. 6 illustrates one stage logic circuit 106 of clock driver 100 of FIG. 5 in more detail. The one stage logic circuit 106 is a complex logic structure that includes an AND logic function, OR logic function, and an invert logic function in a single stage logic circuit. In the illustrated embodiment, logic circuit 106 includes P-channel transistors 126, 128, and 130, and N-channel transistors 132, 134, and 136. In other embodiments, logic circuit 106 may be different. Logic circuits 112 and 118 are similar to logic circuit 106.

P-channel transistor 126 has a current electrode (source) coupled to a power supply voltage terminal labeled "VDD", a control terminal (gate) coupled to receive clock latch control signal CLK_LAT_DC, and a current electrode (drain). P-channel transistor 128 has a source coupled to the drain of P-channel transistor 126, a gate coupled to receive clock signal CLK, and a drain coupled to an output terminal 131. P-channel transistor 130 has a source coupled to the drain of P-channel transistor 126, a gate coupled to receive clock enable signal CLK_EN, and a drain coupled to output terminal 131. N-channel transistor 132 has a drain coupled to output terminal 131, a gate coupled to receive clock signal CLK, and a source. N-channel transistor 134 has a drain coupled to the source of N-channel transistor 132, a gate coupled to receive clock enable signal CLK_EN, and a source coupled to a power supply voltage terminal labeled "VSS".

N-channel transistor 136 has a drain coupled to output terminal 131, a gate coupled to receive clock latch control signal CLK_LAT_DC, and a source coupled to power supply voltage terminal VSS. In the illustrated embodiment, VDD receives a positive power supply voltage, for example, one volt, and VSS is coupled to ground potential. In other embodiments, the power supply voltage may be different. Also, in other embodiments, the conductivity types of the transistors may be different.

Logic circuit 106 has the advantage of providing a complex logic function to the critical clock timing path with only one gate delay.

Figure 7:
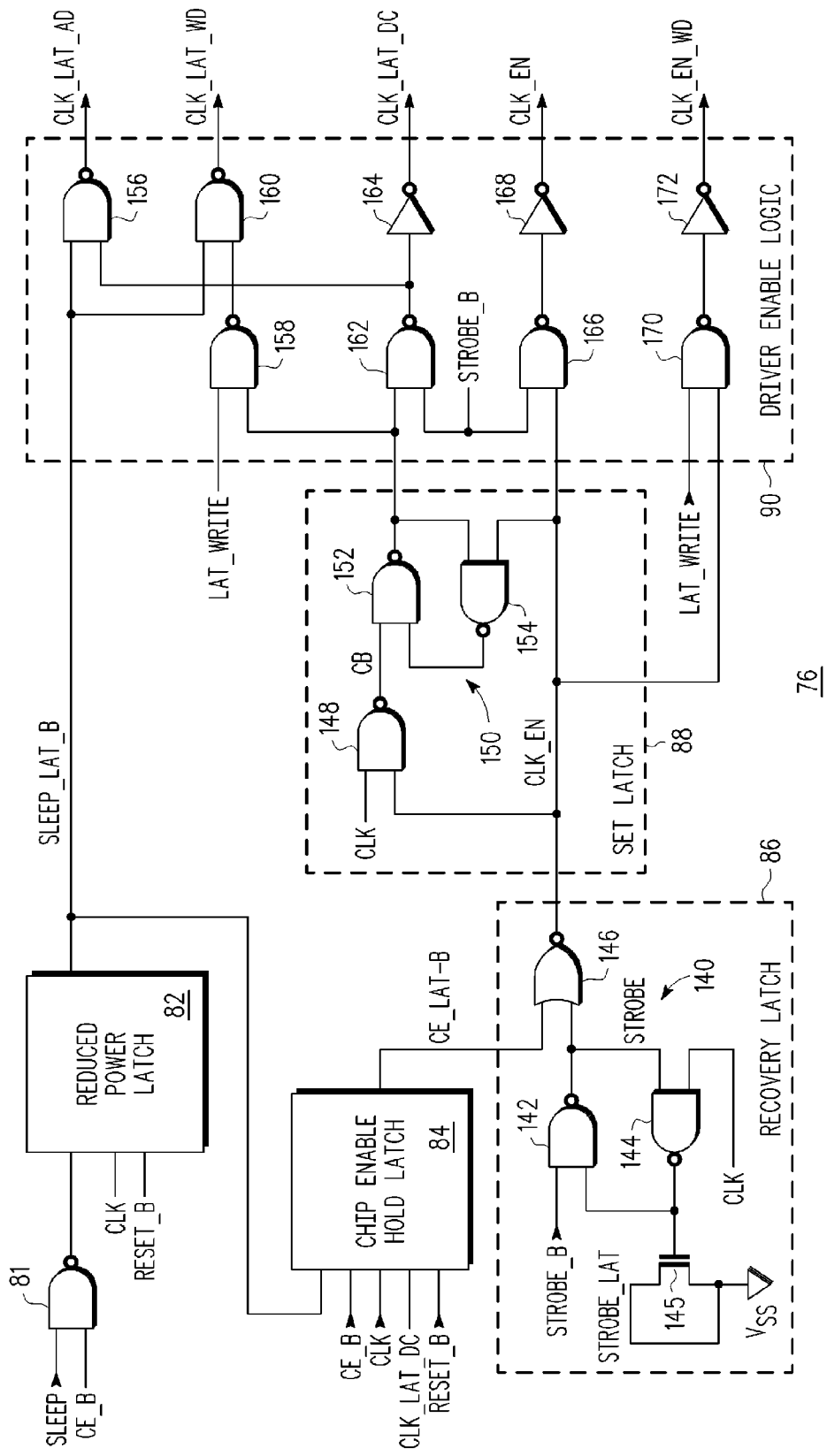
FIG. 7 illustrates the timing control circuit of the memory of FIG. 3 in more detail.

FIG. 7 illustrates timing control circuit 76 in accordance with one embodiment. Timing control circuit 76 includes NAND logic gate 81, reduced power latch 82, chip enable hold latch 84, recovery latch 86, and set latch 88, and driver enable logic 90. Recovery latch 86 includes cross-coupled NAND logic gates 140, NOR logic gate 146, and N-channel 2 5 transistor 145. Cross-coupled NAND logic gates 140 includes NAND logic gates 142 and 144. Set latch 88 includes NAND logic gate 148 and cross-coupled NAND logic gates 150. Cross-coupled NAND logic gates 150 includes NAND logic gates 152 and 154. Driver enable logic 90 includes NAND logic gates 156, 158, 160, 162, 166, and 170, and inverters 164, 168, and 172.

NAND logic gate 81 has an input coupled to receive a control signal labeled "SLEEP", an input coupled to receive a chip enable signal labeled "CE_B", and an output. Reduced power latch 82 has an input coupled the output of NAND logic gate 81, an input coupled to receive clock signal CLK, an input coupled to receive a reset signal labeled RESET_B, and an output for providing a latch signal labeled "SLEEP_LAT_B". Chip enable hold latch 84 has an input coupled to the output of reduced power latch 82, an input coupled to receive chip enable signal CE_B, an input for receiving clock signal CLK, an input for receiving latch control signal CLK_LAT_DC, an input for receiving reset signal RESET_B, and an output for providing latch signal CE_LAT_B. In recovery latch 86, N-channel transistor 145 has a source and drain coupled together to form a plate electrode for a MOS (metal oxide semiconductor) capacitor, and a gate coupled to form another plate electrode. NAND logic gate 142 has an input coupled to receive feedback signal STROBE_B, an input coupled to the gate of transistor 145, and an output for providing signal STROBE. NAND logic gate 144 has an input coupled to the output of NAND logic gate 142, an input coupled to receive clock signal CLK, and an output coupled to transistor 145 and to an input of NAND logic gate 142. NOR logic gate 146 has an input coupled to the output of chip enable hold latch 84, an input coupled to the output of NAND logic gate 142, and an output for providing enable signal CLK_EN. In set latch 88, NAND logic gate 148 has an input coupled to receive clock signal CLK, an input coupled to the output of NOR logic gate 146, and an output. NAND logic gate 152 has a first input coupled to the output of NAND logic gate 148, and a second input and an output. NAND logic gate 154 has an input coupled to the output of NAND logic gate 152, an input coupled to the output of NOR logic gate 146, and an output coupled to the second input of NAND logic gate 152.

In driver enable logic 90, NAND logic gate 156 has a first input coupled to the output of reduced power latch 82, a second input, and an output for providing control signal CLK_LAT_AD. NAND logic gate 158 has an input coupled to receive a control signal labeled "LAT_WRITE", an input coupled to the output of NAND logic gate 152, and an output. NAND logic gate 160 has an input coupled to the output of the reduced power latch 82, and input coupled to the output of NAND logic gate 158, and an output for providing control signal CLK_LAT_WD. NAND logic gate 162 has an input coupled to the output of NAND logic gate 152, an input coupled to receive feedback signal STROBE_B, and an output coupled to the second input of NAND logic gate 156. Inverter 164 has an input coupled to the output of NAND logic gate 162, and an output for providing control signal CLK_LAT_DC. NAND logic gate 166 has an input coupled to receive feedback signal STROBE_B, an input coupled to the output of NOR logic gate 146, and an output. Inverter 168 has an input coupled to the output of NAND logic gate 166, and an output for providing clock enable signal CLK_EN. NAND logic gate 170 has an input for receiving signal LAT_WRITE, and input coupled to the output of NOR logic gate 146, and an output. Inverter 172 has an input coupled to the output of NAND logic gate 170, and an output for providing control signal CLK_EN_WD.

Timing control circuit 76 is used to generate and control the timing of the enable and latch signals to clock driver circuits 78 of FIG. 5. In operation, an active low chip enable signal CE_B is provided to chip enable hold latch 84. When clock signal CLK is a logic low, the logic state of chip enable signal CE-B is propagated to the output of latch 84 as signal CE_LAT_B. The signal CE_LAT_B is gated with signal STROBE from cross-coupled latch 140 in NOR logic gate 146 to form signal CK_EN. To enable memory 60 for an active operation, chip enable signal CE_B is driven to a logic low while clock signal CLK is also a logic low. When recovery from a previous cycle operation is complete, the signal STROBE will also be low. These conditions will assert the output of NOR logic gate 146 (CK_EN) as a logic high. The CK_EN signal is further qualified by signal LAT_WRITE in NAND logic gate 170 and buffered by inverter 172 to produce control signal CLK_EN_WD during a write operation and prior to a rising edge of clock signal CLK. If the various qualifying signals for clock signal CLK are asserted high, the corresponding clock driver paths (FIG. 5) will assert in response to the next rising edge of clock signal CLK. If, on the other hand, the memory is disabled due to CE_B de-asserted as a logic high, the clock driver circuits 78 will remain de-asserted on the next clock cycle. The logic state of signal CE_B is latched on the rising edge of clock signal CLK to cause the desired functional behavior for the duration of the clock cycle. Without chip enable hold latch 84 any logic changes to signal CE_B while the clock signal CLK is high will interfere with the integrity of the active operation. However, there is an active-low reset signal RESET_B that can asynchronously de-assert the enable path regardless of the clock state of clock signal CLK. The reset signal RESET_B allows a user to have certain initialization conditions prior to functional use of memory 60 and the ability to discontinue a current active operation of memory 60.

Figure 1:
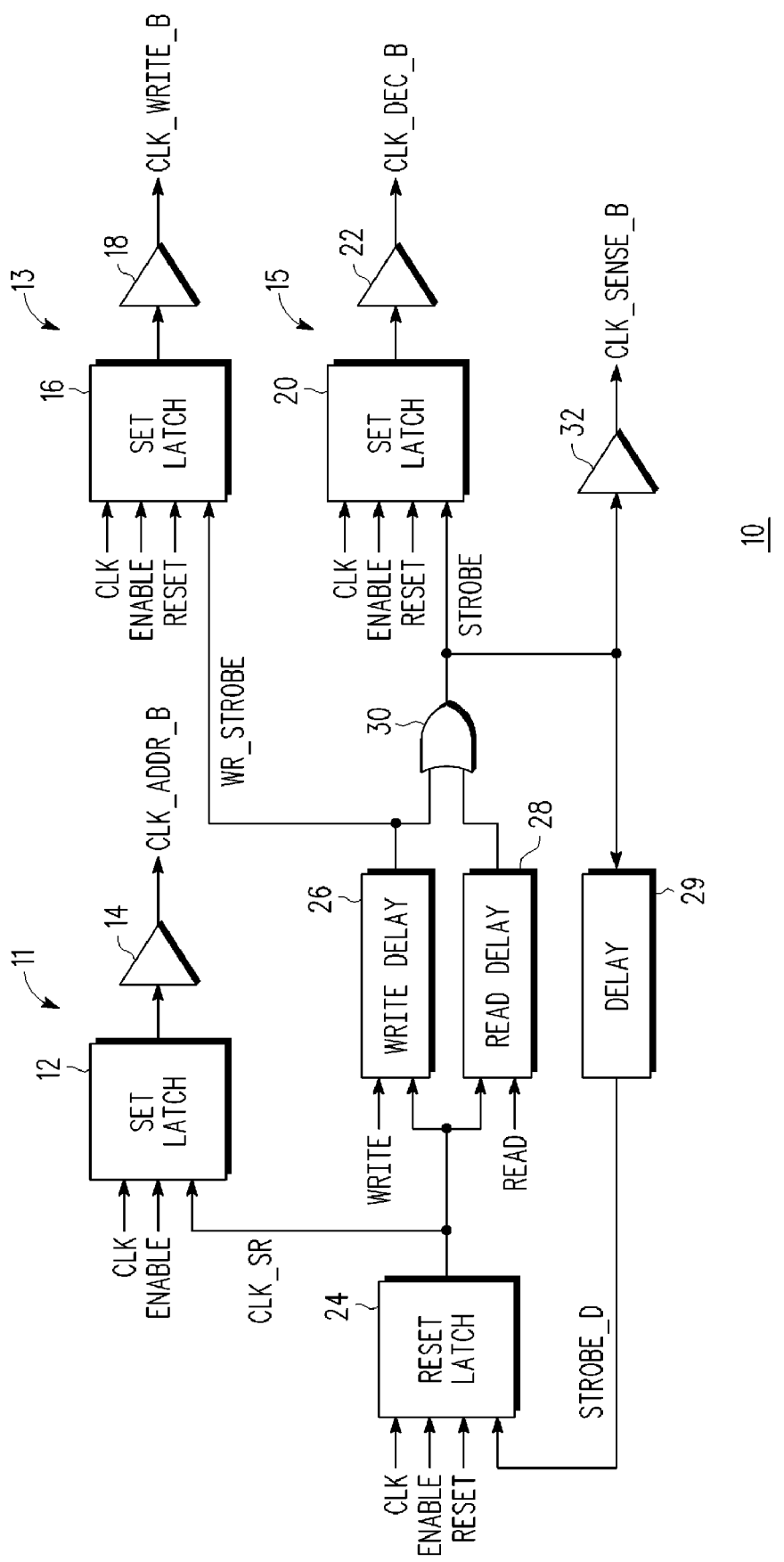
FIG. 1 illustrates a clock timing circuit for a self-timed memory in accordance with the prior art.

In set latch 88 cross-coupled NAND logic gates 150 provides an SR type latch. If clock enable CK_EN is asserted as a logic high the rising edge of clock signal CLK will drive the output of NAND logic gate 148 to a logic low. This transition will cause the cross-coupled latch 150 to be set. The output of NAND logic gate 152, signal CLK_LAT, is buffered to become control signals CLK_LAT_AD, CLK_LAT_WD, and CLK_LAT_DC. In one embodiment, the clock control signals CLK_LAT_AD and CLK_LAT_WD are further controlled by a sleep control path comprising reduced power latch 82. The sleep control path enables a user to have additional control of gating input signals via the clock drivers during clock cycles with inactive memory operations. Also, control signal CLK_LAT_WD is further qualified by the signal LAT_WRITE asserted by a processor (not shown) during a write operation. The set latch 150 functions independently of clock signal CLK logic state once the set latch 150 is a set state. Therefore, the qualified clock driver paths remain asserted independent of the clock signal until the set latch is reset, or recovered, by the recovery latch 86 when the feedback signal STROBE_B is asserted, or by the asynchronous reset signal RESET_B. Because the clock timing control circuit 76 is not in the critical clock timing path, the device size used in the complex gates can be smaller than devices used in the prior art example of FIG. 1 and FIG. 2. Also, recovery of the clock driver paths is reset, or recovered, properly no matter when the system clock falling edge occurs. In addition, only one set latch is used for all of the clock driver circuits, further minimizing device size.

As illustrated in FIG. 4, the assertion of the clock driver signal CLK_DEC_B initiates the assertion of feedback signal STROBE_B after a predetermined self-timed delay. The duration of the predetermined self-timed delay is timed from memory array recovery initiation. At the end of the self-timed delay duration, an active low recovery signal STROBE_B is asserted. The recovery signal STROBE_B has an active pulse duration that is independent of the logic state of clock signal CLK. As a result, the recovery function is latched by cross-coupled latch 140. The signal STROBE_B controls the reset of set latch 88, and the clock signal CLK controls the reset of cross-coupled latch 140. Thus, if the signal STROBE_B returns to a logic high while the clock signal CLK is still high, the output of latch 140 will remain high until the latch is reset by the falling edge of clock signal CLK. If latch 140 were not present, and signal STROBE_B returned to a logic high while clock signal CLK was still a logic high, the enable and latch signals to the clock driver circuits 78 would be re-asserted. If, on the other hand, clock signal CLK is already a logic low when signal STROBE_B returns high, signal STOBE_B will be de-asserted, allowing the set latch 88 to be reset for the next rising edge of clock signal CLK.

Figure 8:
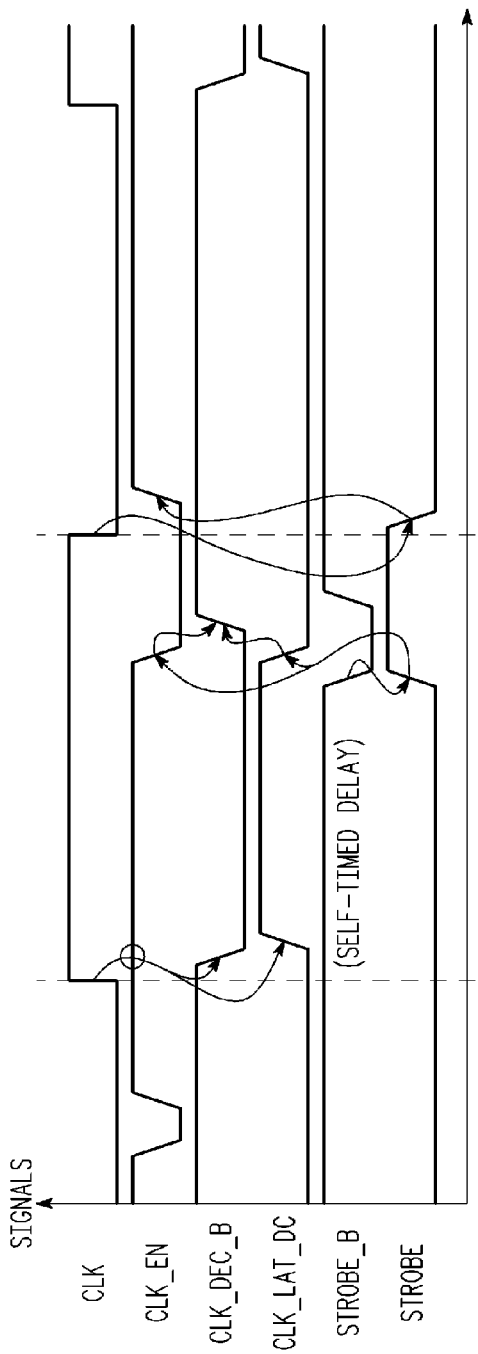
FIG. 8 illustrates a timing diagram of various signals of the memory of FIG. 3.

FIG. 8 illustrates a timing diagram of various signals of the memory of FIG. 3 with recovery of set latch 88 before a falling edge of clock signal clock. The rising edge of clock signal CLK occurs at time t0 and the falling edge of clock signal CLK occurs at time t1. As illustrated in FIG. 8, even though signal STROBE_B returns to a logic high prior to the falling edge of clock signal CLK, the latched recovery signal STROBE does not de-assert until after the falling edge of clock signal CLK.

Figure 9:
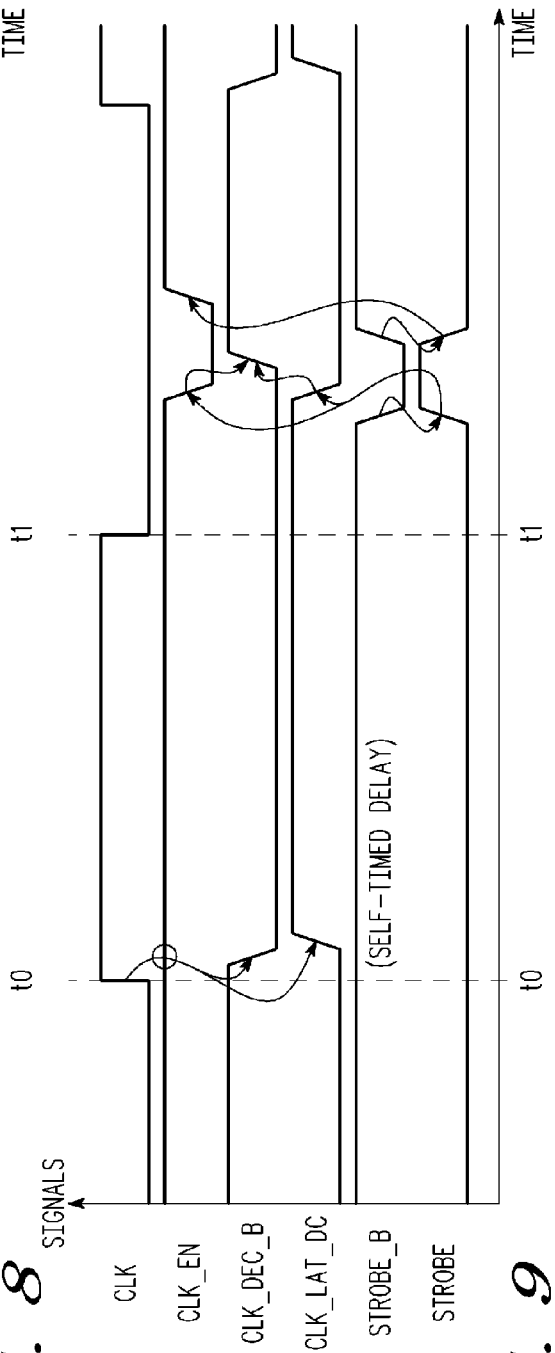
FIG. 9 illustrates a timing diagram of various signals of the memory of FIG. 3.

FIG. 9 illustrates a timing diagram of various signals of the memory of FIG. 3 with recovery of set latch 88 after the falling edge of clock signal CLK. The rising edge of clock signal CLK occurs at time t0 and the falling edge of clock signal CLK occurs at time t1. The de-assertion of signal STROBE is triggered directly from the de-assertion of signal STROBE_B. Therefore, as illustrated in FIG. 8 and FIG. 9, clock driver recovery is independent of the falling edge of clock signal CLK. Note that in FIGS. 8 and 9, a circle at the intersection of athe arrow from the rising edge of clock signal CLK and signal CLK_EN indicate that a logic high signal CLK_EN is required, in the illustrated embodiment, to qualify the other signals down stream.

Various other changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The term "coupled", as used herein, is defined as connected, although not necessarily directly, and not necessarily mechanically.

What is claimed is:

1. A memory comprising:
   a memory array having a plurality of memory cells;
   an address decoder for selecting a memory cell in response to an address; a data input/output circuit for transmitting data to or from the selected memory cell;
   a plurality of clock driver circuits for providing a plurality of clock driver signals for timing an operation of the address decoder and the data input/output circuit during an access to the memory array; and
   a timing control circuit, coupled to the plurality of clock driver circuits, the timing control circuit having a first latch coupled to each of the plurality of clock driver circuits, the first latch for storing a logic state representative of a logic state of each of the plurality of clock driver signals in response to a predetermined edge of a clock signal, the timing control circuit having a second latch coupled to the first latch, the second for restoring the first latch to an initial condition at the end of the memory access in response to a recovery signal.

2. The memory of claim 1, wherein the restoring of the first latch to the initial condition is independent of the clock signal.

3. The memory of claim 2, wherein the second latch comprises:
   a first logic gate having a first input for receiving the recovery signal, a second input, and an output;
   a second logic gate having a first input coupled to the output of the first logic gate, a second input for receiving the clock signal, and an output coupled to the second input of the first logic gate; and
   a third logic gate having a first input for receiving an enable signal, a second input coupled to the output of the first logic gate, and an output coupled to an input of the first latch.

4. The memory of claim 3, wherein the first and second logic gates provide a NAND logic function and the third logic gate provides a NOR logic function.

5. The memory of claim 3, wherein the enable signal, when de-asserted, asynchronously resets the first latch to the initial condition.

6. The memory of claim 2, wherein each of the plurality of clock driver circuits comprises:
   a logic gate having a first input coupled to receive the clock signal, a second input coupled to receive a clock enable signal, and a third input coupled to the first latch, and an output; and
   a buffer circuit having an input coupled to the output of the logic gate, and an output for providing a corresponding one of the clock driver signals.

7. The memory of claim 6, wherein the logic gate provides a one stage AND-OR-INVERT logic function.

8. The memory of claim 2, wherein the memory array is organized as a plurality of blocks of memory cells, wherein each block of the plurality of blocks of memory cells comprises a local recovery circuit, and wherein the local recovery circuit of an active block of the plurality of blocks of memory cells asserts the recovery signal at completion of a memory access.

9. The memory of claim 8, wherein each of the local recovery circuits comprises:
   a delay element for tracking a propagation delay of an access operation to a selected block of the plurality of blocks of memory cells; and
   a tristateable buffer circuit, coupled to the delay element, for providing the recovery signal.

10. A memory comprising:
    a memory array having a plurality of memory cells;
    a plurality of clock driver circuits for providing a plurality of clock driver signals for timing an access operation to the memory array;
    a timing control circuit, coupled to the plurality of clock driver circuits, the timing control circuit having a first latch coupled to each of the plurality of clock driver circuits, the first latch for storing a logic state representative of a logic state of each of the plurality of clock driver signals in response to a first predetermined edge of a clock signal; and
    a recovery circuit comprising a second latch, the second latch coupled to the first latch, the second latch receiving a recovery signal, the recovery signal being asserted in response to completion of the access operation to the memory array, wherein the second latch is for restoring the first latch to an initial condition in response to the recovery signal, and wherein the restoring of the first latch to the initial condition is independent of the clock signal.

11. The memory of claim 10, wherein the second latch comprises:
    a first NAND logic gate having a first input for receiving the recovery signal, a second input, and an output;
    a second NAND logic gate having a first input coupled to the output of the first logic gate, a second input for receiving the clock signal, and an output coupled to the second input of the first logic gate; and
    a NOR logic gate having a first input for receiving an enable signal, a second input coupled to the output of the first NAND logic gate, and an output coupled to an input of the first latch.

12. The memory of claim 11, wherein the enable signal, when de-asserted, asynchronously resets the first latch to the initial condition.

13. The memory of claim 10, wherein each of the plurality of clock driver circuits comprises:
    a one stage AND-OR-INVERT logic gate having a first input coupled to receive the clock signal, a second input coupled to receive a clock enable signal, and a third input coupled to the first latch, and an output; and
    a buffer circuit having an input coupled to the output of the one stage AND-OR-INVERT logic gate, and an output for providing a corresponding one of the clock driver signals.

14. The memory of claim 10, wherein the memory array is organized as a plurality of blocks of memory cells, wherein each block of the plurality of blocks of memory cells comprises a local recovery circuit, and wherein the local recovery circuit of an active block of the plurality of blocks of memory cells asserts the recovery signal at completion of a memory access.

15. The memory of claim 14, wherein each of the local recovery circuits comprises:
   a delay element for tracking a propagation delay of an access operation to a selected block of the plurality of blocks of memory cells; and
   a tristateable buffer circuit, coupled to the delay element, for providing the recovery signal.

16. The memory of claim 10, wherein the memory is characterized as being a self-timed memory.

17. A method comprising:
   providing a memory having a memory array with a plurality of memory cells;
   coupling a clock signal to the memory;
   providing a plurality of clock driver circuits for timing an access to the memory array in response to a predetermined edge of the clock signal;
   providing a latch for storing a logic state representative of a logic state of each of the plurality of clock driver signals in response to the first predetermined edge of the clock signals;
   generating a recovery siginal at completion of the access to the memory array;
   and
   restoring the latch to an initial condition in response to the recovery signal, and
   wherein the restoring of the latch to the initial condition is independent of the clock signal.

18. The method of claim 17, wherein generating a recovery signal further comprises tracking a propagation delay of the access to the memory array to determine when the access to the memory array is complete.

19. The method of claim 17, further comprising asynchronously ending the access to the memory array before completion of the access.

* * * * *